(12) United States Patent
Drachenberg et al.

(10) Patent No.: US 10,838,149 B2
(45) Date of Patent: Nov. 17, 2020

(54) DUAL-CORE FIBER AMPLIFIER FOR SEPARATION OF THERMAL AND NONLINEAR EFFECTS

(71) Applicant: Lawrence Livermore National Security, LLC, Livermore, CA (US)

(72) Inventors: Derrek R. Drachenberg, Livermore, CA (US); Paul H. Pax, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 16/292,601

(22) Filed: Mar. 5, 2019

(65) Prior Publication Data

US 2020/0284983 A1    Sep. 10, 2020

(51) Int. Cl.
| | |
|---|---|
| G02B 6/293 | (2006.01) |
| G02B 6/02 | (2006.01) |
| G02B 6/26 | (2006.01) |
| G02B 6/10 | (2006.01) |
| H03F 3/21 | (2006.01) |

(52) U.S. Cl.
CPC ..... *G02B 6/29332* (2013.01); *G02B 6/02042* (2013.01); *G02B 6/02057* (2013.01); *G02B 6/10* (2013.01); *G02B 6/262* (2013.01); *H03F 3/21* (2013.01)

(58) Field of Classification Search
CPC ............... G02B 6/29332; G02B 6/262; G02B 6/02042; G02B 6/02057; G02B 6/10; H03F 3/21
See application file for complete search history.

(56) References Cited

U.S. PATENT DOCUMENTS

| | | | | |
|---|---|---|---|---|
| 7,242,827 B1* | 7/2007 | Bochove | ............ | G02B 6/02042 385/15 |
| 10,429,580 B2* | 10/2019 | Zalevsky | ............. | G02B 6/3518 |
| 2019/0310420 A1* | 10/2019 | Allen | ................ | G02B 6/29332 |

* cited by examiner

*Primary Examiner* — John Bedtelyon
(74) *Attorney, Agent, or Firm* — John P. Wooldridge

(57) ABSTRACT

A dual-core waveguide architecture provides two evanescently coupled waveguides where a first waveguide is doped with an active gain species to produce optical power and a second waveguide that runs parallel to the first waveguide is configured to collect the power produced by the first waveguide. Power is harvested from the second waveguide.

40 Claims, 5 Drawing Sheets

DUAL-CORE FIBER AMPLIFIER FOR SEPARATION OF THERMAL AND NONLINEAR EFFECTS

STATEMENT AS TO RIGHTS TO INVENTIONS MADE UNDER FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC, for the operation of Lawrence Livermore National Laboratory.

BACKGROUND OF THE INVENTION

Field of the Invention

The present invention relates to high average power fiber and high peak power amplifiers, and more specifically, it relates to the ability to unidirectionally couple light from a core with gain into a passive core until the gain core has emptied.

DESCRIPTION OF RELATED ART

The maximum average power from a single aperture, diffraction limited fiber amplifier is set by the effects of thermal lensing or thermal modal instability (mitigated by small core diameters), and stimulated scattering effects (mitigated by large core areas). These effects combine to limit output power to 2-3 kW (narrowband-beam combinable) and 20-30 kW (broadband). Currently, the highest average power fiber amplifiers have large mode area (LMA) cores and are limited by thermal modal instability (TMI) rather than thermal lensing. This newly observed effect is still under intense investigation, and efforts are being made to mitigate it. Ultimately, fiber laser output power is limited by the need to design for thermal limits (TMI) and nonlinear limits simultaneously. Eliminating the thermal barrier opens new design space limited only by non-thermal effects. Significant effort has been made to increase the nonlinear thresholds of circular core fibers through bandwidth broadening and longitudinal thermal gradients. These approaches have marginally improved the power threshold but have reached their limit.

SUMMARY OF THE INVENTION

Embodiments of the present invention include a dual-core architecture for high average power fiber amplifiers, where one small core is doped with an active gain species to produce optical power and a second larger core is configured to collect that power. This novel architecture breaks the design and performance limits set by nonlinear and thermal effects, which impose competing demands on core size, by separating the effects into different thermally isolated but optically coupled cores. Each core is optimized to mitigate one or the other effect. One key to the invention is that coupled mode theory modeling shows that this architecture can operate in a regime where the oscillatory exchange between the two cores is arrested, and the power transfer is unidirectional from the hot core to the cold core until the hot core is empty, after which all the output power can be extracted from the cold core at the output facet of the fiber. This invention represents a new branch of high average and peak power fiber lasers and a path to break through the current fiber laser power limitations (including thermal modal instability).

The present invention breaks the current limits by separating the two effects into two thermally separate but optically coupled cores. One core, the "hot" core, has a small diameter, is rare-earth doped and provides all of the gain. The other "cold" core has a large area, is un-doped and through evanescent coupling, harvests the power produced in the hot core.

Singly-doped, dual-core fiber amplifiers have been demonstrated for the telecom industry by using the passive (cold) core as a spectral filter to dump unwanted light and shape the spectrum in the active (hot) core. Unlike the telecom version, the present invention seeds the active core, but extracts from the passive core after the maximum possible transfer has been achieved.

Uses of the invention include increasing the power threshold of single mode fiber lasers currently limited by thermal and nonlinear effects. Laser cutting and welding benefit from the present technology.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

The present invention breaks the current thermal and nonlinear limits on fiber lasers by separating the two effects into two thermally separate but optically coupled cores. One core, the "hot" core, has a small diameter, is rare-earth doped and provides all the gain. The other "cold" core has a large area, is without a rare earth dopant and harvests the power produced in the hot core through evanescent coupling. The present invention seeds power into the active (hot) core, and extracts power from the passive (cold) core after the maximum possible amplification in the hot core and transfer to the cold core has been achieved. The hot and cold cores can be a wide range of sizes and refractive indices with the condition that the detuning between their propagation constants does not impact the power transfer nor cause fast modulation on that transfer.

A general embodiment includes a first waveguide that has been doped with an active gain species. The cross-sectional area of this waveguide allows optical amplification to occur in the saturated regime. The embodiment includes a second waveguide that has not been doped with an active gain species. The cross-sectional area of this waveguide reduces at least one intensity dependent nonlinearity. Such deleterious effects include, but are not limited to, Stimulated Brillouin Scattering (SBS), Stimulated Raman Scattering (SRS), and Self Phase Modulation (SPM). The two waveguides are fixed in proximity such that evanescent coupling can occur from and too each waveguide. The intensity gain coefficient of the first waveguide is at least a factor of 4 greater than the evanescent amplitude coupling coefficient between the first waveguide and the second waveguide.

The individual elements that make up the invention are one core (waveguide) with a dopant that can provide optical gain, one core without a dopant that acts as a power collector and reservoir, one or more optional bridge waveguide element(s) between the two cores that provides thermal isolation and dispersion (for wavelength and modal selectivity) if desired, and a pump cladding that encompasses all the other elements. Exemplary bridge waveguide elements include those having a circular graded index, a circular step index, a rectangular step index, or other profile that can satisfy phase matching requirements. The primary hot and cold cores can be, e.g., formed by a step index, by a photonic crystal array or by any other means to create a waveguide. The gain element can be, e.g., a rare earth dopant, a nonlinear medium or any other type of optical gain element. Although the sizes of the hot and cold cores can be different, the propagation constants of the desired modes must be matched for resonant coupling to occur.

Figure 1A:
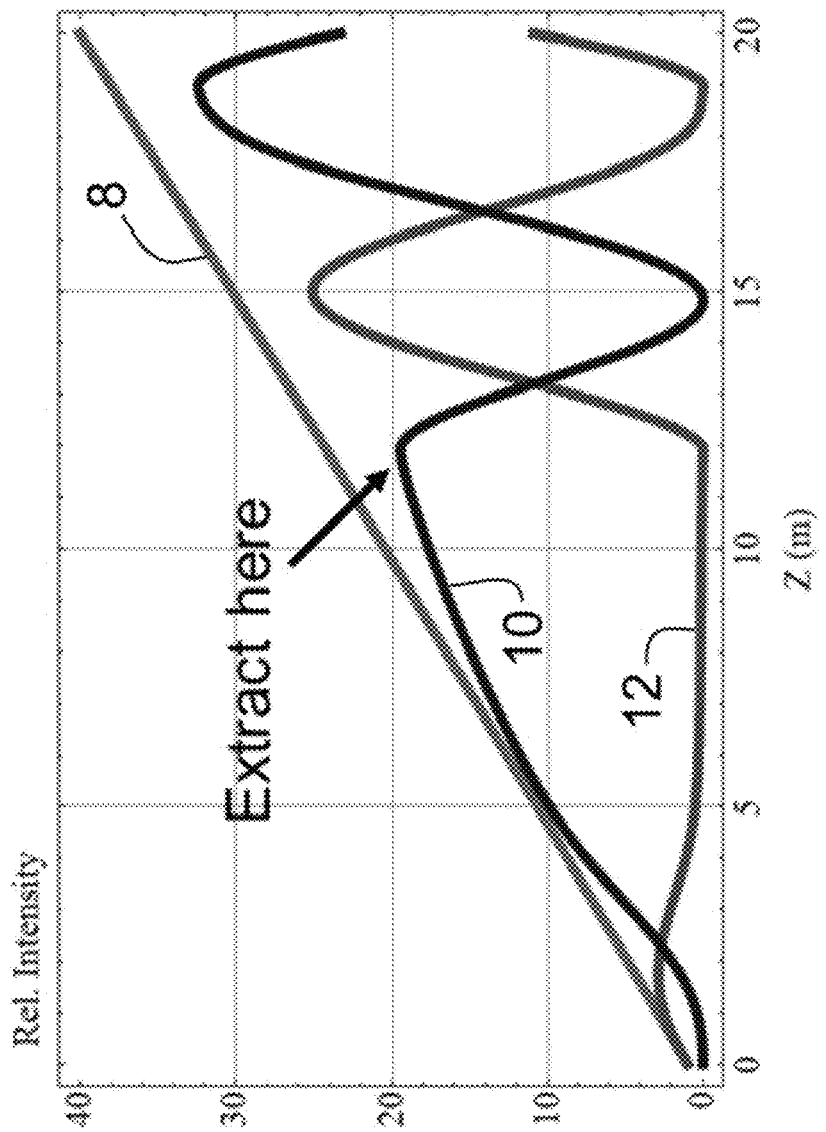
FIG. 1A shows the relative intensity in each core in an embodiment of the invention.
Figure 1B:
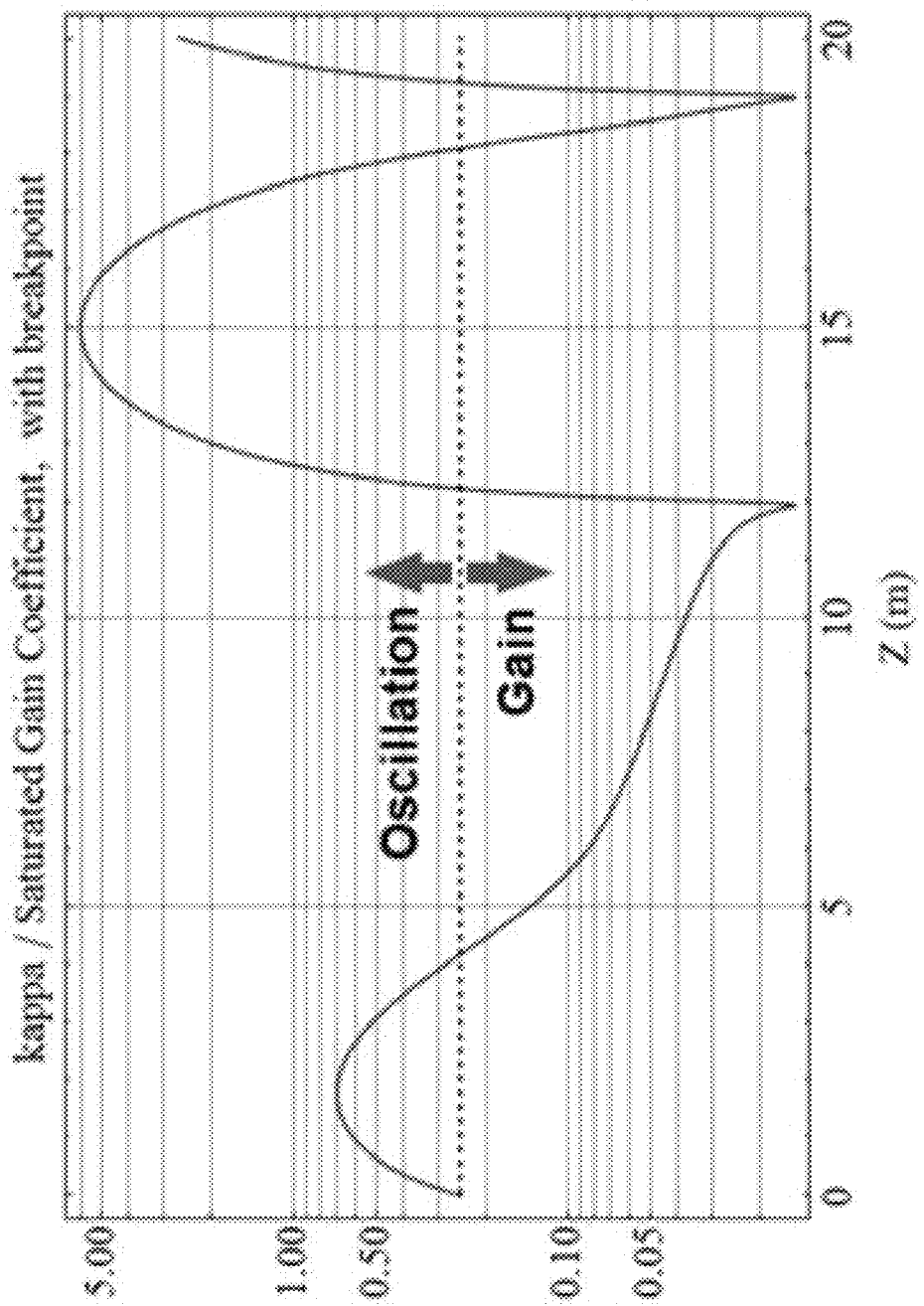
FIG. 1B shows kappa/alpha and the associated threshold for each regime as a horizontal line.

Preliminary modeling, using coupled mode theory (CMT) shows that this architecture can operate in a regime where the oscillatory exchange of power between the cores is arrested. In two identical and passive coupled waveguides, the power oscillates between the cores with behavior described with sines and cosines. However, when one core exhibits gain while the other is passive, and the transfer coefficient is less than ¼ the gain coefficient, the coupled mode equations are described by hyperbolic sines and cosines. In this regime, the power transfer is unidirectional from the hot core to the cold core until the hot core is empty and all the output power can be extracted from the cold core. The power in the cold core grows exponentially, without oscillation; and because the oscillations are suppressed, the small hot core never experiences intensities high enough to bring on deleterious nonlinear effects. FIGS. 1A and 1B show the two regimes of interest. FIG. 1A shows the base gain 8 and the relative intensity in each core (10=cold core, 12=hot core). FIG. 1B shows kappa/alpha and the associated threshold for each regime as a horizontal line. Kappa is the coupling coefficient and alpha is the gain coefficient. Comparing the two plots, it is clear that, in this case, the ideal extraction point is just before the onset of the oscillatory regime, before the hot core 12 is empty (at about 12 m). This fiber amplifier architecture enables significantly higher performance. The present invention can be directly applied to current thermally limited fiber lasers.

Figure 2:
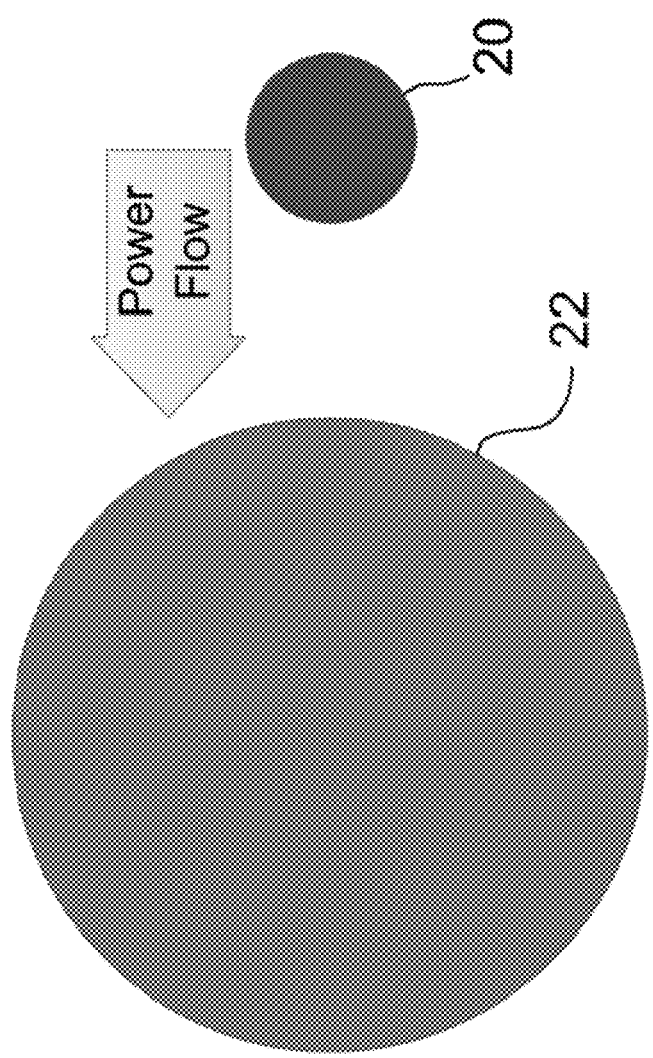
FIG. 2 shows as basic embodiment where the small core is rare earth doped and the large core is a passive waveguide.

FIG. 2 shows a basic embodiment. Here, the small hot core 20 is rare earth doped. The large cold core 22 is a passive waveguide, doped only as needed to define a waveguide. Through evanescent coupling, power flows from the small hot core 20 to the large cold core 22 from which power is harvested. The hot core is small to avoid thermally induced effects such as thermal modal instability and thermal lensing. Cold core 22 is large to avoid peak power induced effects such as stimulated Brillouin scattering (SBS), stimulated Raman scattering, damage, etc. Other embodiments may utilize a bridge to increase the separation distance.

In operation, the heat generating amplification occurs only in the hot core and power transfers to the cold core. If operating entirely in the oscillation regime (kappa/gain >0.25), amplifier length and coupling lengths must be sufficiently matched in order to extract the power at the peak of transfer. In the ideal case of operating in the suppressed oscillation regime (kappa/gain <0.25), power is continuously transferred to the cold core and energy does not return to the hot core until the hot core has been completely depleted. At the correct amplifier length, just before the hot core is completely depleted, the energy exits at full power from the cold core.

We have developed a simple model for 'Harvester' Fiber Amplifier. Initially we neglect gain saturation, and the model consists of only two coupled waveguides, A and B, with A having gain. The coupling is specified by κ, intensity gain by a, and we further assume the two waveguides are on resonance. The governing equations are then:

$$\frac{\delta}{\delta_z} A = i\kappa B + \frac{\alpha}{2} A$$

$$\frac{\delta}{\delta_z} B = i\kappa A$$

These have closed form solutions, depending on the relative size of by κ and a:

$$A(z) = \begin{cases} e^{\frac{\alpha}{4}z}\left(\frac{\alpha}{\sqrt{\alpha^2-16\kappa^2}}\text{Sinh}\left[\frac{1}{4}\sqrt{\alpha^2-16\kappa^2}z\right] + \text{Cosh}\left[\frac{1}{4}\sqrt{\alpha^2-16\kappa^2}z\right]\right), \alpha \geq 4\kappa \\ e^{\frac{\alpha}{4}z}\left(\frac{\alpha}{\sqrt{-\alpha^2+16\kappa^2}}\text{Sin}\left[\frac{1}{4}\sqrt{-\alpha^2+16\kappa^2}z\right] + \text{Cos}\left[\frac{1}{4}\sqrt{-\alpha^2+16\kappa^2}z\right]\right), \alpha < 4\kappa \end{cases}$$

$$B(z) = \begin{cases} 4ie^{\frac{\alpha}{4}z}\left(\frac{\kappa}{\sqrt{\alpha^2-16\kappa^2}}\text{Sinh}\left[\frac{1}{4}\sqrt{\alpha^2-16\kappa^2}z\right]\right), \alpha \geq 4\kappa \\ 4ie^{\frac{\alpha}{4}z}\left(\frac{\kappa}{\sqrt{-\alpha^2+16\kappa^2}}\text{Sin}\left[\frac{1}{4}\sqrt{-\alpha^2+16\kappa^2}z\right]\right), \alpha < 4\kappa \end{cases}$$

This simple model shows the key novelty of the invention. The result is a base gain of half the value expected of a single waveguide, and for a<4κ, periodic intensity oscillation between waveguides A and B; and for a≥4κ, purely exponential growth in waveguide B, above the base of half gain.

In reality, amplifiers experience saturation of their gain, accompanied by pump depletion. Accordingly, we extended the model to two coupled waveguides, A and B, with A having saturable gain, $I_{sat}$ $$\frac{\delta}{\delta_z}A = i\kappa B + \frac{\alpha}{2(1+|A|^2/I_{sat})}A$$

$$\frac{\delta}{\delta_z}B = i\kappa A$$

These no longer have closed form solutions, but we can plot numerical solutions. One interesting solution has parameters a=31.28 m$^{-1}$, κ=a/67, $I_{sat}$=2×10$^{-4}$ W/μm$^2$. This solution gives a gain much larger than coupling, unless saturated, and the gain vs amplifier length results are shown in FIG. 1A All the examples given so far are for two simple phase matched coupled cores without any elements in between them. To further separate heat in the small core from negatively impacting the large core (TMI or Thermal Lensing), a single or multiple bridge waveguide(s) may be placed in between the cores. These bridge waveguides may or may not be high dispersion which adds wavelength and modal selectivity to the device. For example, of several wavelengths amplified in the gain core, only a small bandwidth that can cross the bridge would be transferred and extracted as output. Or, for example, of several modes being amplified in the gain core, only one would be transferred to the passive core and extracted as output. Or, for example, a single mode in the gain core could be transferred to one of many modes (fundamental or high order mode) in the passive core. All of these variations and other similar variations are included in the present invention.

Figure 3:
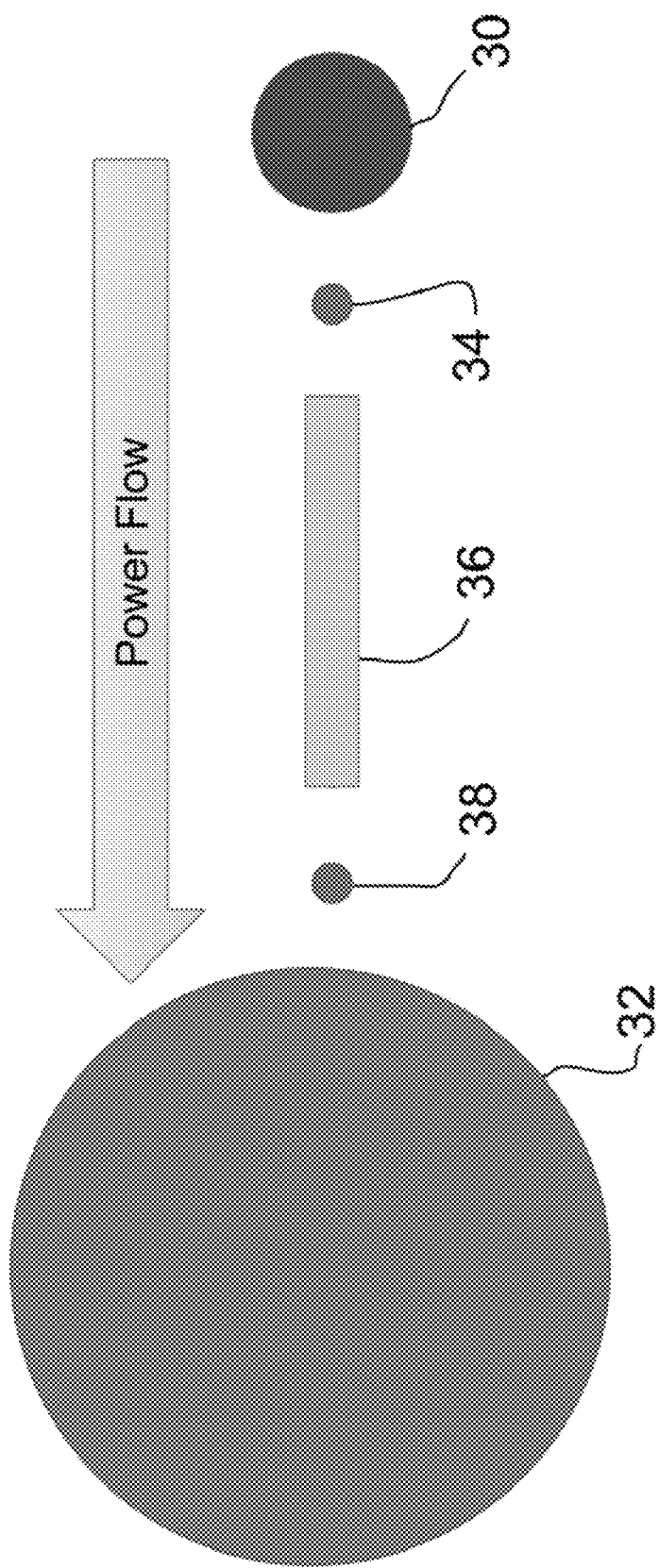
FIG. 3 shows an embodiment where power flows from an active rare earth doped core to a passive core by flowing through a bridging structure comprising a slab waveguide and two high-dispersion waveguides.

FIG. 3 shows an embodiment where power flows from a small hot core 30 to a large cold core 32 by flowing through a high dispersion waveguide 34, a slab bridge 36 and a second high-dispersion waveguide 38.

Figure 4:
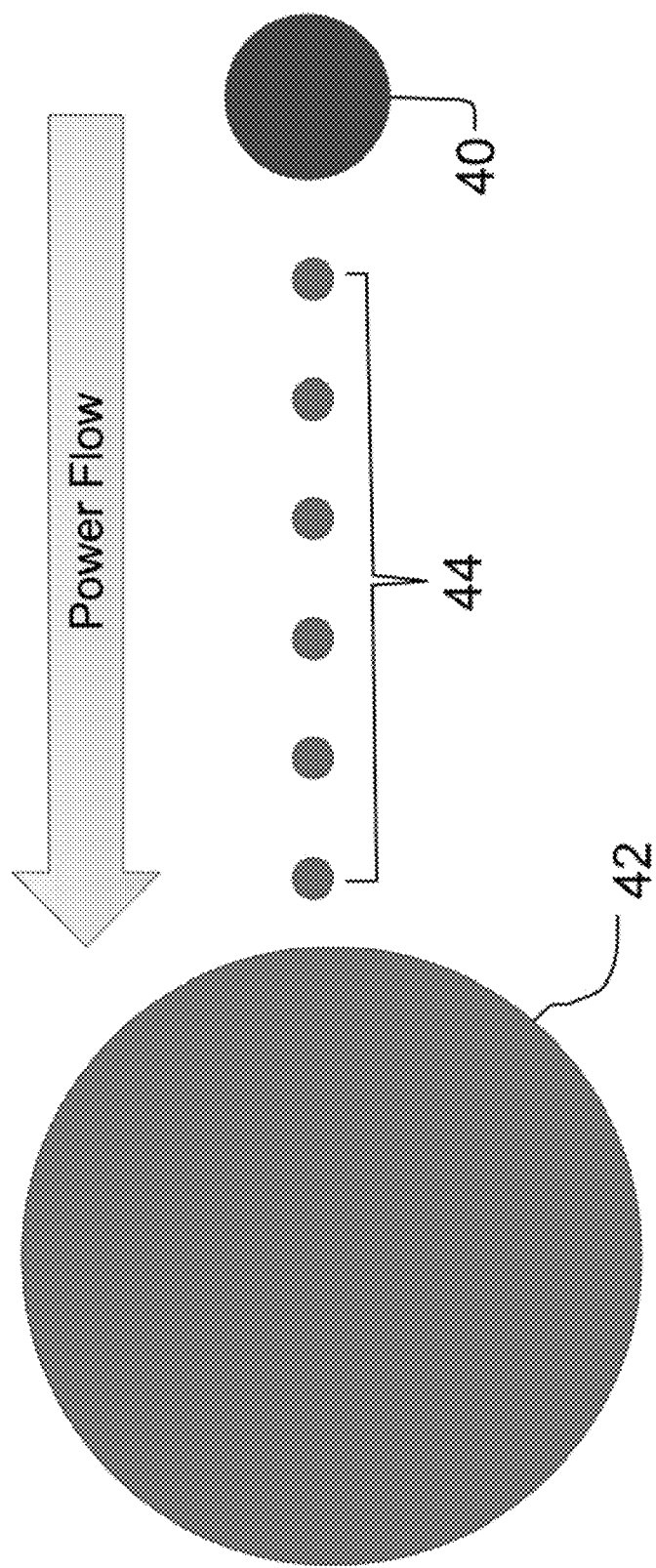
FIG. 4 shows an embodiment where power flows from a small rare earth doped core to a large passive core by flowing through a bridging structure comprising a string of high dispersion waveguides.

FIG. 4 shows an embodiment where power flows from a small hot core 40 to a large cold core 42 by flowing through a string bridge 44 of high dispersion waveguides.

The foregoing description of the invention has been presented for purposes of illustration and description and is not intended to be exhaustive or to limit the invention to the precise form disclosed. Many modifications and variations are possible in light of the above teaching. The embodiments disclosed were meant only to explain the principles of the invention and its practical application to thereby enable others skilled in the art to best use the invention in various embodiments and with various modifications suited to the particular use contemplated. The scope of the invention is to be defined by the following claims.

We claim:

1. An apparatus, comprising:
   a first waveguide doped with an active gain species, wherein said first waveguide has a cross-sectional area such that optical amplification in said first waveguide can occur in a saturated regime;
   a second waveguide that has not been doped with any said active gain species, wherein said second waveguide has a cross-sectional area that reduces at least one nonlinearity; and
   means for evanescently coupling together said first waveguide and said second waveguide, wherein an intensity gain coefficient of said first waveguide is at least a factor of 4 greater than an evanescent coupling coefficient between said first waveguide and said second waveguide.

2. The apparatus of claim 1, wherein said first waveguide comprises a fiber optic first core, wherein said second waveguide comprises a fiber optic second core, wherein said apparatus further comprises a media in contact with and having a lower index of refraction than said first core and said second core.

3. The apparatus of claim 1, wherein said first waveguide comprises a fiber optic first core, wherein said second waveguide comprises a fiber optic second core, wherein said apparatus further comprises a media surrounding and in contact with and having a lower index of refraction than said first core and said second core.

4. The apparatus of claim 1, wherein said active gain species comprises a rare-earth element.

5. The apparatus of claim 1, wherein said first waveguide and said second waveguide operate in a regime where an oscillatory exchange between them is arrested, and a power transfer is unidirectional from said first waveguide to said second waveguide, after which all output power in said second waveguide can be extracted from said second waveguide.

6. The apparatus of claim 1, wherein said first waveguide and said second waveguide are together configured to operate in a regime where an oscillatory exchange between them is attenuated, and power transfers from said first waveguide to said second waveguide after which output power is extracted from said second waveguide.

7. The apparatus of claim 1, wherein power transfers from said first waveguide to said second waveguide after which output power is extracted from said second waveguide.

8. The apparatus of claim 1, further comprising means for seeding said first waveguide and further comprising means for optically pumping said first waveguide.

9. The apparatus of claim 1, wherein said means for evanescently coupling together said first waveguide and said second waveguide comprises fixedly locating said first waveguide and said second waveguide a distance apart that allows evanescent coupling.

10. The apparatus of claim 1, wherein said means for evanescently coupling together said first waveguide and said second waveguide comprises at least one bridge waveguide element.

11. The apparatus of claim 10, wherein said at least one bridge waveguide element comprises an index structure selected from the group consisting of a circular graded index, a circular step index and a rectangular step index.

12. The apparatus of claim 10, wherein said at least one bridge waveguide element comprises an index profile that satisfies phase matching requirements to allow evanescent coupling together of said first waveguide and said second waveguide.

13. The apparatus of claim 10, wherein said at least one bridge waveguide element comprises sufficient dispersion to provide wavelength and modal selectivity from said first waveguide to said second waveguide.

14. The apparatus of claim 10, wherein, of several wavelengths amplified in said first waveguide and wherein all together said several wavelengths comprise a bandwidth, only a portion of said bandwidth of said several wavelengths can be transferred to said second waveguide, wherein said at least one bridge waveguide element comprises dispersion, wherein said bandwidth is set by said dispersion of said at least one bridge waveguide element and (i) a first coupling condition between said at least one bridge waveguide element and said first waveguide and (ii) a second coupling condition between said at least one bridge waveguide element and said second waveguide.

15. The apparatus of claim 10, wherein said at least one bridge waveguide element comprises dispersion, wherein when a plurality of modes comprising propagation constants are amplified in said first waveguide, said dispersion of said at least one bridge waveguide element is sufficient to discriminate between each of said propagation constants of said plurality of modes of said first waveguide and only one mode of said plurality of modes can be transferred to said second waveguide.

16. The apparatus of claim 10, wherein said at least one bridge waveguide element comprises dispersion, wherein when a plurality of modes comprising propagation constants are amplified in said first waveguide said dispersion of said bridge waveguide element is sufficient to discriminate between each of said propagation constants of any mode of said plurality of modes that has transferred to said second waveguide, and wherein a single mode of said plurality of modes in said first waveguide can be transferred to one of many modes in said second waveguide.

17. The apparatus of claim 10, wherein said at least one bridge waveguide element comprises a first high-dispersion waveguide having sufficient dispersion to effect wavelength or mode selective coupling, wherein said at least one bridge waveguide element further comprises a slab and a second high-dispersion waveguide, wherein power flows from said first waveguide to said high-dispersion waveguide to said slab to said second high-dispersion waveguide to said second waveguide.

18. The apparatus of claim 10, wherein said at least one bridge waveguide element comprises a string bridge of high dispersion waveguides.

19. The apparatus of claim 1, wherein said first waveguide and said second waveguide have a length and a separation that is sufficiently matched in order to extract the power at the peak of transfer.

20. The apparatus of claim 1, wherein said second waveguide has a length that is shorter than the length which would result in a reversal of power away from said second waveguide and toward said first waveguide.

21. A method, comprising:
providing a first waveguide doped with an active gain species, wherein said first waveguide has a cross-sectional area such that optical amplification in said first waveguide can occur in a saturated regime;
providing a second waveguide that has not been doped with any said active gain species, wherein said second waveguide has a cross-sectional area that reduces at least one nonlinearity;
providing means for evanescently coupling together said first waveguide and said second waveguide, wherein an intensity gain coefficient of said first waveguide is at least a factor of 4 greater than an evanescent coupling coefficient between said first waveguide and said second waveguide;
seeding said first waveguide with seed light;
pumping said first waveguide to produce amplified light from said seed light, wherein a portion of said amplified light is transferred via said evanescent coupling from said first waveguide to said second waveguide to produce transferred light; and
extracting at least a portion of said transferred light from said second waveguide.

22. The method of claim 21, wherein said first waveguide comprises a fiber optic first core, wherein said second waveguide comprises a fiber optic second core, wherein said apparatus further comprises a media in contact with and having a lower index of refraction than said first core and said second core.

23. The method of claim 21, wherein said first waveguide comprises a fiber optic first core, wherein said second waveguide comprises a fiber optic second core, wherein said apparatus further comprises a media surrounding and in contact with and having a lower index of refraction than said first core and said second core.

24. The method of claim 21, wherein said active gain species comprises a rare-earth element.

25. The method of claim 21, wherein said first waveguide and said second waveguide operate in a regime where an oscillatory exchange between them is arrested, and a power transfer is unidirectional from said first waveguide to said second waveguide, after which all output power in said second waveguide is extracted from said second waveguide.

26. The method of claim 21, wherein said first waveguide and said second waveguide are together configured to operate in a regime where an oscillatory exchange between them is arrested, and power transfers from said first waveguide to said second waveguide after which output power is extracted from said second waveguide.

27. The method of claim 21, wherein power transfers from said first waveguide to said second waveguide after which output power is extracted from said second waveguide.

28. The method of claim 21, further comprising providing means for seeding said first waveguide and further comprising providing means for pumping said first waveguide.

29. The method of claim 21, wherein said means for evanescently coupling together said first waveguide and said second waveguide comprises fixedly locating said first waveguide and said second waveguide a distance apart that allows evanescent coupling.

30. The method of claim 21, wherein said means for evanescently coupling together said first waveguide and said second waveguide comprises at least one bridge waveguide element.

31. The method of claim 30, wherein said at least one bridge waveguide element comprises an index structure selected from the group consisting of a circular graded index, a circular step index and a rectangular step index.

32. The method of claim 30, wherein said at least one bridge waveguide element comprises an index profile that satisfies phase matching requirements to allow evanescent coupling together of said first waveguide and said second waveguide.

33. The method of claim 30, wherein said at least one bridge waveguide element comprises sufficient dispersion to provide wavelength and modal selectivity from said first waveguide to said second waveguide.

34. The method of claim 30, wherein, of several wavelengths that may be amplified in said first waveguide and wherein all together said several wavelengths comprise a bandwidth, only a portion of said bandwidth of said several wavelengths can be transferred to said second waveguide, wherein said at least one bridge waveguide element comprises dispersion, wherein said bandwidth is set by said dispersion of said at least one bridge waveguide element and (i) a first coupling condition between said at least one bridge waveguide element and said first waveguide and (ii) a second coupling condition between said at least one bridge waveguide element and said second waveguide.

35. The method of claim 30, wherein said at least one bridge waveguide element comprises dispersion, wherein when a plurality of modes comprising propagation constants are amplified in said first waveguide, said dispersion of said at least one bridge waveguide element is sufficient to discriminate between each of said propagation constants of said plurality of modes of said first waveguide and only one mode of said plurality of modes can be transferred to said second waveguide.

36. The method of claim 30, wherein said at least one bridge waveguide element comprises dispersion, wherein when a plurality of modes comprising propagation constants are amplified in said first waveguide said dispersion of said bridge waveguide element is sufficient to discriminate between each of said propagation constants of any modes of said plurality of modes that has transferred to said second waveguide, and wherein a single mode of said plurality of modes in said first waveguide can be transferred to one of many modes in said second waveguide.

37. The method of claim 30, wherein said at least one bridge waveguide element comprises a first high-dispersion waveguide having sufficient dispersion to effect wavelength or mode selective coupling, wherein said at least one bridge waveguide element further comprises a slab and a second high-dispersion waveguide, wherein power flows from said first waveguide to said high-dispersion waveguide to said slab to said second high-dispersion waveguide to said second waveguide.

38. The method of claim 30, wherein said at least one bridge waveguide element comprises a string bridge of high dispersion waveguides.

39. The method of claim 21, wherein said first waveguide and said second waveguide have a length and a separation that is sufficiently matched in order to extract power at the peak of transfer.

40. The method of claim 21, wherein said second waveguide has a length that is shorter than the length which would result in a reversal of power away from said second waveguide and toward said first waveguide.

* * * * *